United States Patent [19]

Bladh

[11] Patent Number: 5,270,670
[45] Date of Patent: Dec. 14, 1993

[54] HIGH FREQUENCY PRODUCING DEVICE AND OSCILLATOR COMPRISING DIFFERENTIAL AMPLIFIERS

[75] Inventor: Mats A. R. Bladh, Tullinge, Sweden

[73] Assignee: Telefonaktiebolaget L M Ericsson, Stockholm, Sweden

[21] Appl. No.: 942,271

[22] Filed: Sep. 9, 1992

[30] Foreign Application Priority Data

Sep. 10, 1991 [SE] Sweden ............................ 9102605

[51] Int. Cl.⁵ ................. H03B 5/36; H03B 19/14; H03K 3/023
[52] U.S. Cl. .................................... 331/74; 331/77; 331/158; 331/DIG. 3
[58] Field of Search ............... 331/74, 77, 78, 116 R, 331/158, DIG. 3

[56] References Cited

U.S. PATENT DOCUMENTS 3,916,345  10/1975  Eberlein et al.
5,136,263   8/1992  Lane .................................. 331/158

FOREIGN PATENT DOCUMENTS 3930126  3/1991  Fed. Rep. of Germany.

OTHER PUBLICATIONS

W. Blood, Jr., "MECL System Design Handbook", Motorola Semiconductor Products Inc., pp. 224–228 (1988).

*Primary Examiner*—David Mis
*Attorney, Agent, or Firm*—Burns, Doane, Swecker & Mathis

[57] ABSTRACT

A circuit is provided for an oscillator circuit comprising a differential amplifier such as an ECL line receiver which directly, in one step outputs a symmetrical square wave signal. This is obtained by means of a symmetrical connection of the bias voltage to the input terminals of the ECL-line receiver through two substantially equally large resistors. A feedback loop comprises, as is conventional, a crystal and a trimming capacitor or a capacitor which may be controlled in some other way as well as a resistor. The capacitor will together with the resistor form a low-pass filter for the control of the oscillating condition of the circuit. Further, an overtone synthesizer is provided adapted to generate even multiples of the frequency of an input signal and it comprises a second ECL line receiver, the positive and negative output terminals of which are directly connected to each other. With appropriate voltage levels of the input signal, an output signal is obtained containing spikes or dips which are repeated at a frequency corresponding to the double frequency of the input signal. From this signal, harmonic components may be obtained having frequencies corresponding to even multiples of the input signal frequency. For the filtering of a chosen multiple a LC-network may be used and for the shaping of the signal another ECL line receiver is used, on the output terminals of which a square wave having ECL-levels is obtained. When the overtone synthesizer is built into the same unit as the oscillator above a very simple circuit is obtained which is not costly, is easily used in other applications, has a high output frequency and has an output signal of well defined levels.

13 Claims, 5 Drawing Sheets

HIGH FREQUENCY PRODUCING DEVICE AND OSCILLATOR COMPRISING DIFFERENTIAL AMPLIFIERS

FIELD OF THE INVENTION

The present invention relates to a high frequency producing device and an oscillator circuit with a frequency multiplier circuit constructed by means of ECL line receivers, i.e. ECL, differential amplifiers, or generally directly coupled differential amplifiers.

BACKGROUND OF THE INVENTION

Oscillator circuits comprising transistors as active elements have been used for a long time. With the arrival of integrated circuits, ready made amplifiers of that kind have been used as active elements in oscillators. For high frequency use, only some types of electronic circuits are suitable for instance directly coupled amplifiers. One kind of these amplifiers comprises ECL-circuits (ECL is here Emitter Coupled Logic), for which the output signal is taken from the emitter of an output transistor. The corresponding output terminal further must be connected by means of an extra outside resistor, a pull down resistor, to ground in order to have the voltage on the emitter to be defined. This extra resistor thus is not included in the integrated circuit.

ECL-circuits in addition have a high input impedance, approximately like the base of a transistor, and a low output impedance like the emitter of a transistor, typically 6–9 Ohms. An ECL-amplifier typically has a gain of about 5.

As amplifying elements in oscillators, circuits comprising ECL line receivers, i.e. ECL differential amplifiers having a differential output with a non-inverting and an inverting output signal, have been proposed. These are usually utilized for converting signal like sinus waves from other oscillators or amplifiers to the electric levels used by ECL-circuits or generally for amplification of other signals to ECL-levels.

Oscillator circuits using ECL line receivers are for instance illustrated in "MECL System Design Handbook", Motorola Semiconductor Products Inc., 4th edition 1988, pps. 224–228.

For generating high frequencies, high frequency crystals using harmonic overtones must be used. In some respects, they are not suitable and therefore fundamental tone crystals are generally used. They thus have a lower frequency, which requires a frequency multiplication of the lower frequency.

A frequency multiplication circuit using a differential amplifier of the integrated circuit type, having non-inverting and inverting input terminals and output terminals is disclosed in the German Offenlegungschrift DE A1 39 30 126. To both of the input terminals, the same DC bias is applied and the frequency to be multiplied is fed to one of the input terminals. The other input terminal is connected to ground for signal frequencies through a decoupling capacitor. The output terminals are directly connected to each other, i.e. short-circuited with each other, which also can be expressed as "wired-OR". In this way, an output signal of a sine wave type is obtained. The way described of driving the amplifier, however, will give on the output terminals thereof, only a signal having a frequency corresponding to the double frequency of the input signal.

DESCRIPTION OF THE INVENTION

According to the invention, a circuit is provided for an oscillator circuit with a differential amplifier such as an ECL line receiver, which directly in one step produces a symmetrical output signal of square wave type and having suitable voltage levels for use in further circuits constructed around the same type of differential amplifier, that is for instance having ECL-levels. This is obtained by a symmetrical connection of the bias voltage to the input terminals of the differential amplifier.

Further, an overtone synthesizer or generally a circuit for producing high frequencies is provided generating even multiples, that is not only for the double frequency, of the frequency of an input signal and it is comprised of, as in the cited German document, a differential amplifier, e.g. an ECL line receiver, the positive output and the negative output terminals of which are directly connected to each other. The differential amplifier is driven by the input electric wave in such a way, that with a suitable DC biasing of the input terminals, a wave having small "dips" or "spikes" at the double frequency of the input signal, is produced. Since this wave is highly nonsinusoidal, it will have a frequency content containing even frequencies of the input signal, such that the amplitudes of the first harmonic overtones are not negligible and can easily be filtered out.

The filtering may be provided by an LC-circuit feeding another differential amplifier of the same kind. Also, the signal source may contain, if it originally generates non-sinusoidal waves such as square wave or waves as described above having dips or spikes, an LC-circuit to produce the desired output sine-shaped signal.

The signal source may also comprise an oscillator as above, comprising a differential amplifier of the same kind. The output signal of the oscillator is then taken from one of the input terminals of the differential amplifier comprised in the oscillator.

BRIEF DESCRIPTION OF THE DRAWINGS

The invention will now be described as exemplary embodiments with reference to the accompanying drawings, on which

DESCRIPTION OF PREFERRED EMBODIMENTS

Figure 1:
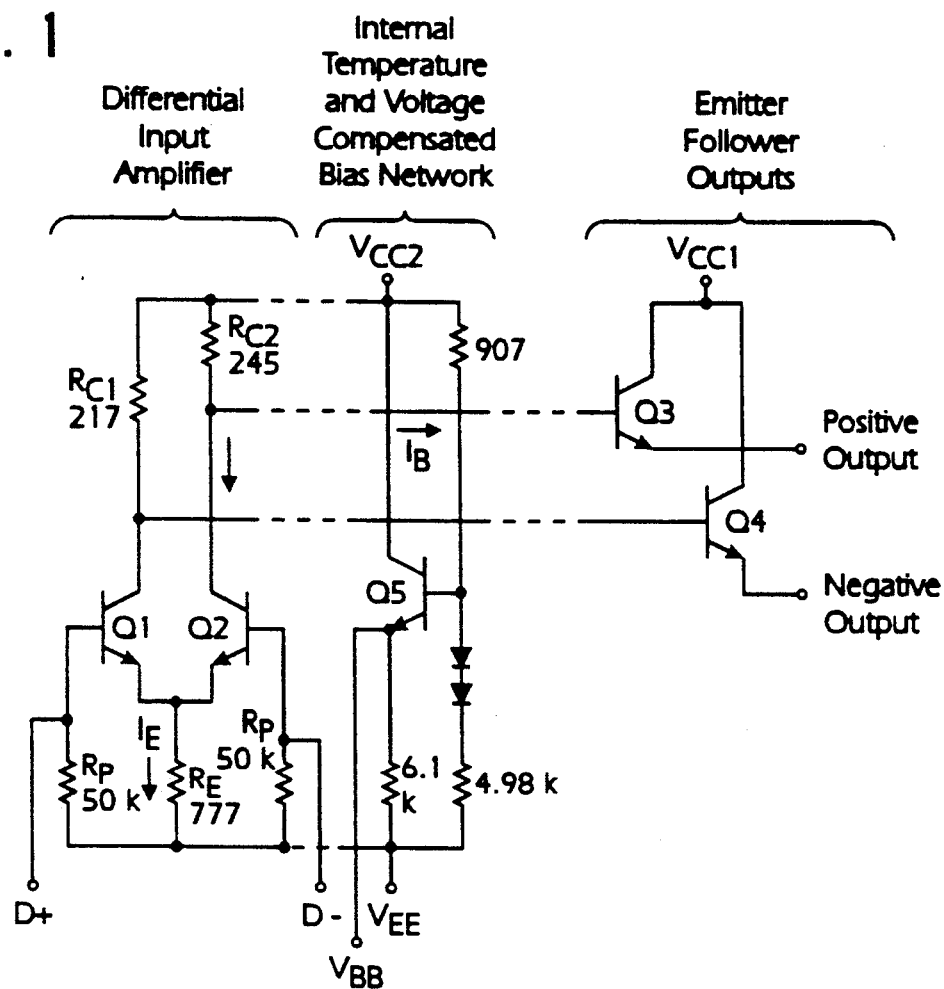
FIG. 1 shows an example of the internal construction of an ECL line receiver.

In FIG. 1, an example of an ECL line receiver is shown, basically as illustrated in the manual from Motorola mentioned above. It comprises a conventional differential amplifier which can be seen to the left in the Figure. It is constructed by means of two transistors Q1 and Q2, to the bases of which the input voltages are supplied. One input terminal is termed a noninverting input terminal D+ and the other one an inverting input terminal D−. The bases are connected to equally large base resistors $R_p$ and the emitters are connected to each other and to an emitter resistor $R_E$ or in certain cases a constant current source. The collectors of these transistors are provided with collector resistors $R_{C1}$ and $R_{C2}$ respectively. From the collectors, lines are provided to emitter follower circuits and particularly to the bases of output transistors Q3 and Q4, which inside the circuit are not provided with any emitter resistor—pull-down resistor—and on the emitters of which the output voltages are obtained. One output terminal is then said to be the positive or non-inverted output terminal and the other one the negative or inverted output terminal. In practical use, the emitters of these emitter follower transistors Q3 and Q4 naturally must be provided with suitable exterior pull-down resistors.

The collectors of the transistors $Q_1$ and $Q_2$ in the simple differential amplifier are driven by a voltage $V_{CC2}$ and the collectors of the transistors $Q_3$ and $Q_4$ in the emitter follower portion are driven by a voltage $V_{CC1}$. The emitters of the transistors $Q_1$ and $Q_2$ in the differential amplifier portion are through the resistor $R_E$ connected to a voltage $V_{EE}$. In the standard connection of ECL-circuits, $V_{CC1}=V_{CC2}=0$ is used (the connectors are connected to ground) and $V_{EE}=-5V$. The input terminals of the circuit must have a suitable DC-level and it is obtained by means of a particular voltage stabilized portion associated with the circuit providing a bias voltage $V_{BB}$, in the standard case of $-1,29$ V. This bias voltage is connected to the input terminals through resistors having suitable magnitudes and will then give the circuit a suitable operating point. High frequency signals to the inputs may be connected through decoupling capacitors having a sufficiently large capacitance.

ECL-circuits may also be connected in other ways than in the standard case having, for instance, all driving voltages increased by 5 V. Thus all emitters will be connected to ground. This connection can be termed pseudo-ECL.

Figure 2:
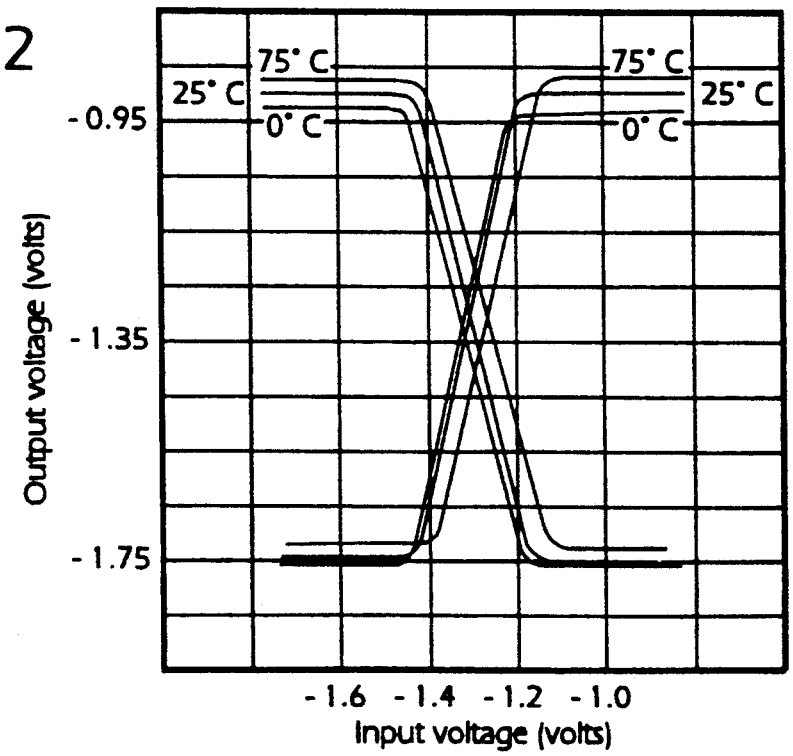
FIG. 2 shows voltage-voltage characteristics of an ECL line receiver.

A In FIG. 2, voltage characteristics are shown for various temperatures for an ECL line receiver of the type illustrated in FIG. 1. It can be seen that on the inputs there is an active region between about −1.4 and −1.2 V, centred around the bias voltage −1.3 V, which has the nominal value −1.29 V. The output voltages are centred in the same way but have a larger logical swing and will move between about −1.75 and −0.90 V, which corresponds to a gain of more than 4.

Figure 3:
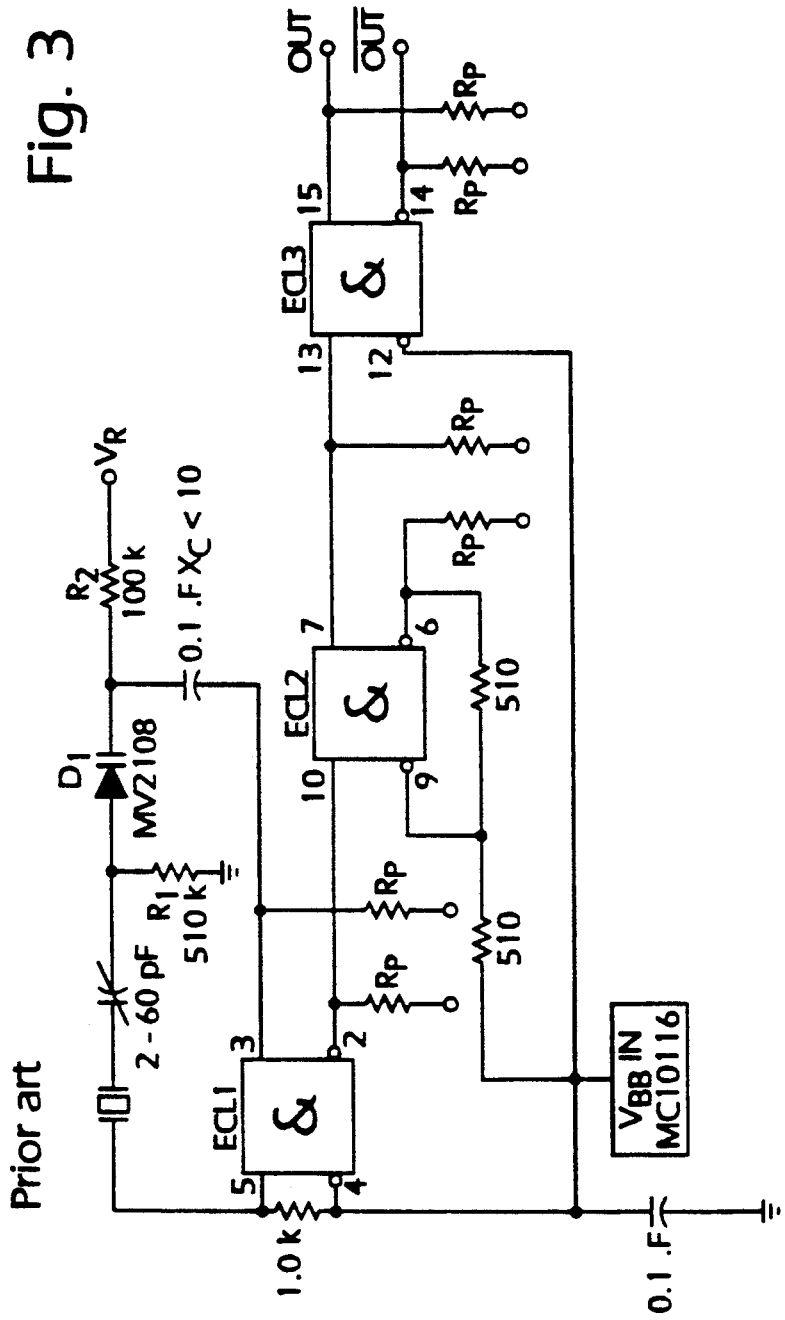
FIG. 3 shows a prior oscillator for the fundamental frequency of a crystal.

In FIG. 3, a voltage controlled crystal oscillator is illustrated, which is similar to the oscillator circuit in the above mentioned manual. In the oscillator circuit, an ECL line receiver ECL1 is arranged. In the feedback line thereof, between the positive output terminal and the non-inverting input terminal, a crystal is connected in series with a variable capacitor and a capacitor diode. The capacitive value of the capacitive diode is varied by means of the DC-voltage being applied thereon. Further the circuit contains a decoupling capacitor, which for the frequencies considered has an impedance practically equal to zero. The other portion of the connections producing an oscillation in the circuit comprises a resistor connected between the positive and negative input terminals of the ECL line receiver utilized, the negative input terminal being connected to ground through a decoupling capacitor. With suitable magnitudes of the components mentioned, an oscillation is obtained in the circuit in such a way that on the output terminals of the ECL line receiver utilized a square wave is provided. This can be fed to further ECL line receivers ECL2 and ECL3 for an amplification and possibly a shaping.

Over the capacitor diode $D_1$ a portion of a control voltage $V_R$ is applied by means of a connection of one end of the capacitor diode to ground through a large resistor. The other end of the capacitor diode $D_1$ is, through another large resistor, connected to the control voltage $V_R$. Due to the decoupling capacitor mentioned in the feedback line and due to the other capacitor and the crystal in the circuit, which for DC function as an interrupt, the control voltage applied will be partly applied over the capacitor diode. The capacitor value thereof may then be varied by varying said control voltage $V_R$.

As to the DC-bias of the ECL line receiver ECL1, the noninverting input terminal thereof is connected through the resistor mentioned also to the bias-voltage $V_{BB}$. The inverting input terminal will then be directly connected to this voltage. Further the output terminals of the ECL line receiver ECL1 are connected to the constant voltage $V_{EE}$, for instance equal to −5 V in the standard connection, through emitter resistors or pull-down resistors $R_p$.

The two ECL line receiver circuits containing ECL2, ECL3 to the right in FIG. 3 are used for amplifying and shaping the signal obtained from the oscillator circuit constructed around the ECL line receiver ECL1, in such a way that a square wave having the electric levels suitable for ECL is obtained.

Figure 4:
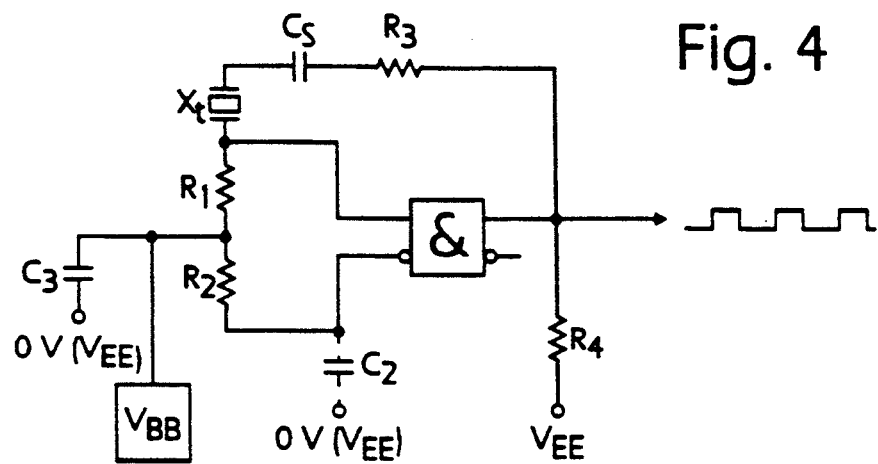
FIG. 4 shows an oscillator according to the invention for the fundamental frequency of a crystal, FIG. 5 schematically shows an overtone synthesizer for even multiples of the frequency of an input sinus voltage.

In FIG. 4, an oscillator circuit according to the invention is illustrated, wherein the biasing of the input terminal is symmetrically arranged. This simple oscillator circuit contains in the feedback line a crystal $X_t$, a capacitor $C_s$ and a resistor $R_3$. This feedback loop is as above connected between the noninverting input terminal and the positive output terminal of an ECL line receiver. Further this positive input terminal of the ECL line receiver is connected to ground or the constant emitter drive voltage $V_{EE}$ through a resistor $R_1$ and a decoupling capacitor $C_3$, which thus will short-circuit for the oscillator frequencies. As to the DC-supply, this is arranged in such a way that both input terminals of the ECL line receiver are connected to the biasing voltage $V_{BB}$ through resistors $R_1$ and $R_2$, which have an equal magnitude. In this way a symmetrical biasing of the ECL line receiver is obtained which will give a pulse-to-pulse ratio of 50% in the square wave obtained. In addition this output terminal, where the signal is produced, is as above connected to ground or to a constant emitter voltage $V_{EE}$ through a pull-down resistor $R_4$.

The negative input terminal of the ECL line receiver can be decoupled to ground or to the constant emitter drive voltage $V_{EE}$ through a capacitor $C_2$, but it can give the circuit a too much stability, so that an oscillation cannot start, that is the capacitor $C_2$ may make the circuit too void of noise. The resistor $R_3$ in the feedback line has a value, generally of the order of magnitude 10-500 Ohms, and prevents the circuit from oscillating with an erroneous frequency. This can be explained by the fact that this resistor together with the capacitance of the feedback line operates as a low pass filter.

By means of the circuit solution in FIG. 4, a square wave is obtained having ECL-levels without the requirement of any further pulse shaping or amplifying steps requiring more ECL line receivers as in the prior circuit of FIG. 3. On the input terminals of the ECL line receiver instead a sinus-shaped signal is obtained which can be fed from there for use in other circuits, as will be illustrated in more detail hereinafter.

ECL-circuits are normally used for high frequencies and an oscillator for fundamental tone crystals of the types illustrated in FIGS. 3 and 4 are generally used for frequencies in the region of 10-25 MHz. In many applications, however, higher frequencies are needed and a possibility will then be to use some kind of frequency multiplier device. The square wave provided by the oscillator on the output terminals of the ECL line receiver contains odd multiples or odd harmonic overtones of the fundamental tone frequency of the oscillator wave and these overtones may in the conventional way be filtered out and amplified for providing square waves having a higher frequency.

Figure 5:
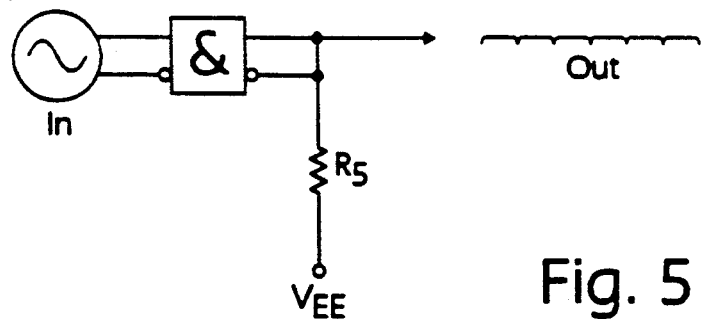

A frequency multiplication by means of a device providing the double frequency and generally even multiples of the fundamental tone frequency in a sinus wave fed to an ECL line receiver is illustrated in FIG. 5. Here the two output terminals of the ECL line receiver are connected in a wired-OR-connection and this common terminal is in the usual way connected to a constant voltage such as ground or a constant emitter voltage $V_{EE}$ through an emitter resistor $R_5$. If the input signal from the sinus wave source has a sufficient magnitude, a voltage is obtained on the output terminal comprising a fairly constant voltage interrupted by negative "dips" occurring at the times when the input signal changes its polarity, that is the dips occur at a frequency corresponding to the double frequency of the input signal.

Figure 6:
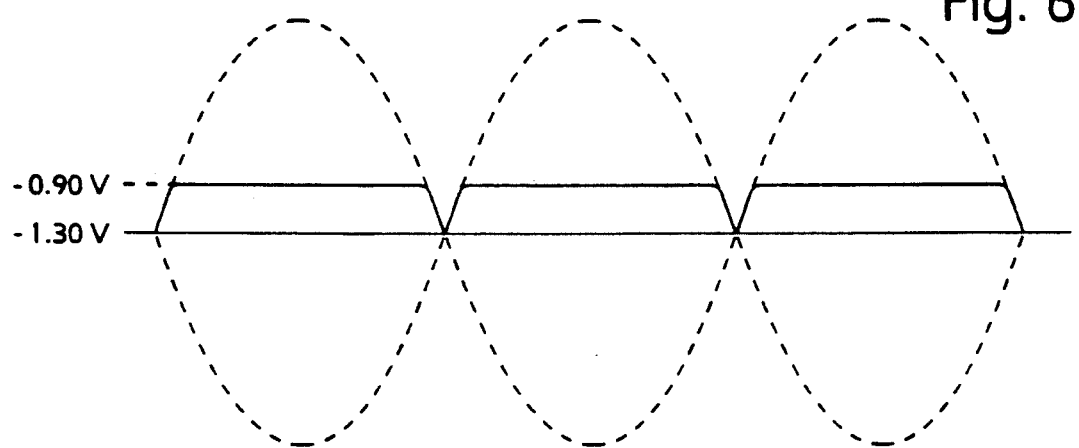
FIG. 6 shows the waveform obtained from the circuit of FIG. 5.

This output signal is shown in a larger scale in FIG. 6. The dotted curves are fictitious curves corresponding to a differential amplifier having a constant amplification without any saturation, the constant amplification being obtained from the central, sloping straight line parts of the curves in FIG. 2. These two dotted sinusoidal curves in FIG. 6 intersecting each other at about 1.3 V represent the output signals on the positive and negative output terminals of the differential amplifier. The line drawn in full represents the actual output signal from the connected output terminals. It has flat portions with a voltage level corresponding to the saturation level of the ECL line receiver. The flat portions thus correspond to the upper horizontal part of the curves in FIG. 2 and as obtained from FIG. 2 this voltage is about −0.90 V. Between the flat portions there are dips, which follow the fictitious output curves and thus correspond to the upper part of the sloping curve portions in FIG. 2, i.e. the part which is located above the intersection of these curve portions in the centre of the diagram.

The input sinusoidal signal of the ECL line receiver will generally have a peak-to-peak voltage of at least about 0.3 V, preferably of at least 0.5 V, compare the diagram in FIG. 2, in order to produce the waveform illustrated in FIG. 6.

Since the output voltage has a shape heavily deviating from the pure sinus shape its frequency content will consist of multiples of the frequencies of said "dips" and it will thus contain frequencies corresponding to even multiples of the frequency of the incoming sinusoidal signal.

Figure 7:
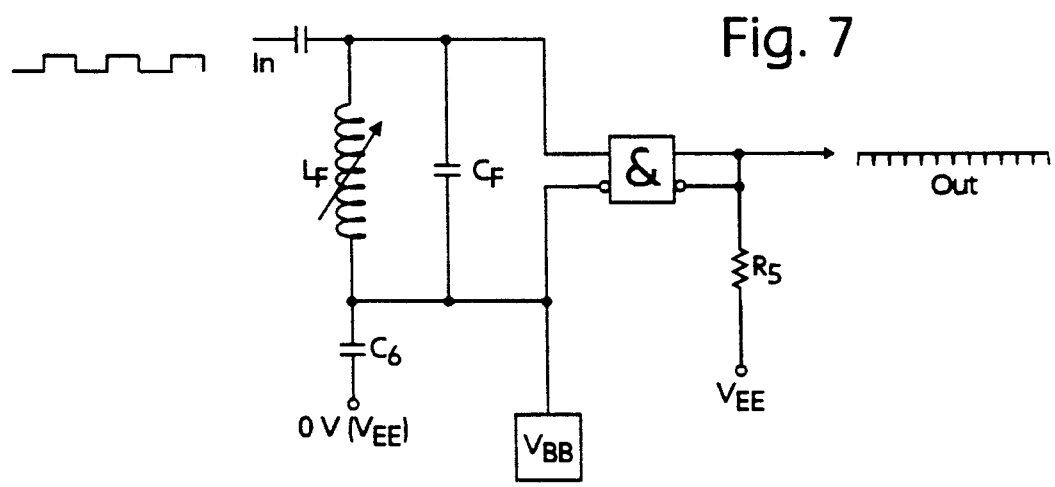
FIG. 7 shows an overtone synthesizer for even multiples of the frequency of an input signal, which is not sinus shaped.

In order to obtain a suitable sinus signal on the input terminal of the circuit in FIG. 5 it can be connected in parallel with the input terminals of the circuit in FIG. 5 or be provided with a simple filter circuit on its input terminal, the latter case being illustrated in FIG. 7. Here an input signal is supplied which has a high frequency and which is not necessarily sinus-shaped, through a capacitor $C_1$ to the positive or non-inverting input terminal of an ECL line receiver. Between the inverting and non-inverting input terminals of said ECL line receiver a variable inductor $L_F$ and a capacitor $C_F$ are located in parallel. The inverting input terminal is in addition decoupled to ground or the constant emitter drive voltage $V_{EE}$ through a decoupling capacitor $C_6$. The level control of the DC-voltage on the inverting input terminal of said ECL line receiver is provided by the bias-voltage $V_{BB}$, possibly supplemented with a resistor (not shown), and the non-inverting input terminal from the biasvoltage $V_{BB}$ through the inductor $L_F$, which normally has a very low resistance. With suitable components and component values in this LC-circuit a pure sinus voltage, having a frequency equal to the fundamental frequency or an odd multiple of the fundamental frequency of the incoming pulse signal, is fed to the ECL line receiver, which in the same way as in FIG. 5 then will provide a frequency doubled signal having a "dip-shaped" appearance.

Figure 8:
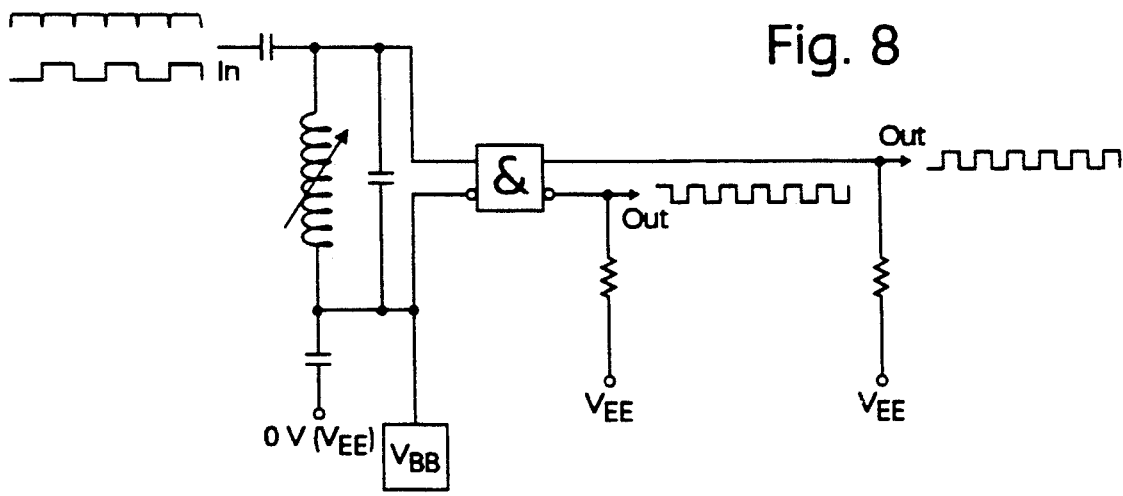
FIG. 8 shows filtering and shaping of an input pulsating voltage and FIG. 9 shows a practical application example having three ECL line receiver circuits comprising oscillator, overtone synthesizer, filter and pulse shaper.

For filtering and amplification and conversion to ECL-levels of an overtone component, a circuit according to FIG. 8 may be used, which principally coincides with the circuit according to FIG. 7 except that the output terminals of the ECL line receiver are not connected to each other but both thereof or only one is connected to ground or the constant emitter voltage $V_{EE}$ through emitter resistors in the way indicated above. Square-shaped waves may then be provided having a frequency defined partly by the fundamental frequency of the incoming voltage, and partly by the components of the LC-filter disposed on the input of the ECL line receiver.

Figure 9:
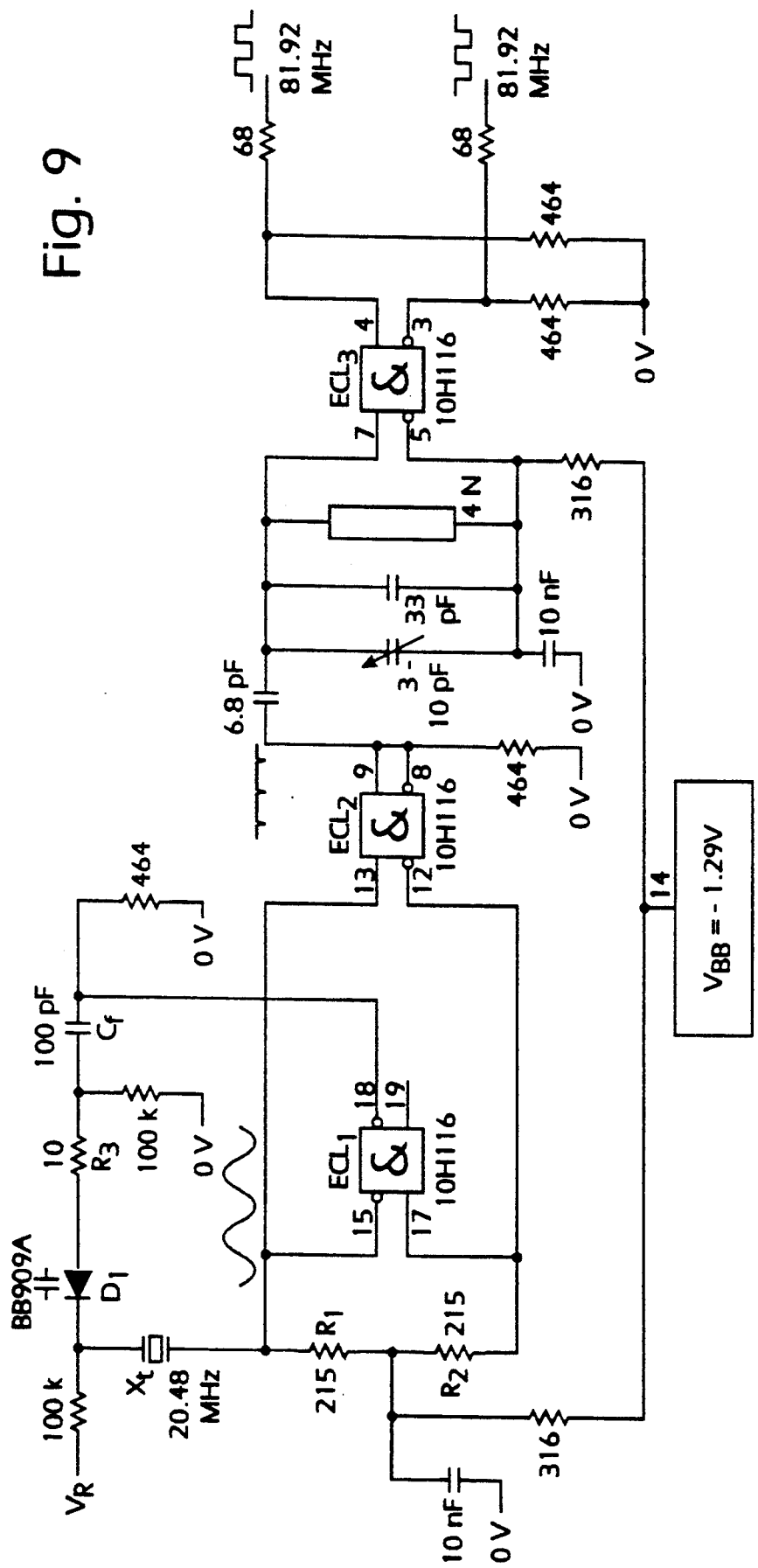

Finally in FIG. 9, a practical embodiment is illustrated of a voltage controlled oscillator provided with an overtone synthesizer for even multiples of the fundamental tone frequency. In the circuit, an output frequency of 81,92 MHz is obtained, i.e. a multiplication of 4 of the fundamental frequency 20,47 MHz of the crystal used, being of type NDK type 51. The ECL-circuits are comprised in one capsule, being type MC10H116 of Motorola containing precisely three ECL line receivers. The ECL line receiver circuits are connected as "pseudo-ECL" having emitters connected to ground. The bias-voltage $V_{BB}=-1,29$ V, which is also taken from the same capsule, is then taken in relation to the collector voltage of +5 V. The numbering of the pins connected is shown in the Figure. The resistance values (as in FIG. 3) shown have no indication of the unit used but are in the usual way given in Ohms. The inductor in the filter part having the reference 4N contains four turns of a conductor directly formed in the conductive pattern on the pattern board and can be estimated to have an inductance of about 75 nH. Further it is observed that the control voltage for the variable capacitor diode $D_1$ of type BB909A is connected in the opposite way or with an opposite polarity compared to the connection in FIG. 3. This will eliminate the requirement of the relatively large capacitor $c$, which short-circuits for the signal frequency, in FIG. 3, which together with the resistance ($R_2$ in FIG. 3) in the control input line can function as a low pass filter and thereby not allow a too rapid control of the oscillator frequency. that from the input terminals of the ECL line receiver in the fundamental tone oscillator leftmost in the Figure the sinus signal taken being provided to the ECL line receiver in the centre of the Figure in the over tone synthesizer for even multiples of the fundamental tone frequency.

Further, this circuit is constructed by a composition of the circuits in FIGS. 4, 7 and 8. It will be observed that the output terminals of the ECL line receiver in the last filtering and level controlling step rightmost in the Figure are provided with serial resistors for serial termination of the output signals.

I claim:

1. A device for producing high frequency electric signals comprising:
   a source providing an electric sinus-shaped periodic signal having a first frequency,
   a first differential amplifier having non-inverting and inverting input terminals as well as positive and negative output terminals, the signal on the negative output terminal normally, when connected as a conventional differential amplifier, being the negative of the signal on the positive output terminal,
   an electric connection of said source to the input terminals of the first differential amplifier, said sinus voltage thus being supplied to the first differential amplifier,
   an electric connection of the positive and negative output terminals of the first differential amplifier to each other, said output terminals also being connected to ground or a first constant voltage through a load resistance,
   wherein the electric sine signal source is arranged to deliver said sinus signal with such a voltage level, that the output signal from said first differential amplifier, if the output terminals thereof were not connected to each other, would be saturated over a substantial portion of the period of the incoming sine signal, whereby on the output terminals connected to each other a pulsating voltage is obtained having a frequency content of even multiples of said first frequency.

2. A device according to claim 1, wherein the output terminals, which are connected to each other, of said first differential amplifier are connected through a filter circuit to an input terminal of a second differential amplifier, whereby on the output terminals thereof, which are connected through resistors to ground, square waves are obtained.

3. A device according to claim 2, wherein the filter circuit is LC-type, which comprises an inductor and a capacitor.

4. A device according to claim 2, wherein the filter circuit comprises
   a series capacitor having one terminal connected to the output terminals of the first differential amplifier, which are connected to each other, and another terminal connected to said input terminal of the second differential amplifier, and
   a capacitor and an inductor, which are connected in parallel over the two input terminals of the second differential amplifier.

5. A device according to claim 1, wherein said sinus signal source comprises a source producing a periodic signal and a filter circuit filtering out a desired sinus-shaped signal.

6. A device according to claim 1, wherein said sinus signal source comprises an oscillator which in turn comprises:
   a third differential amplifier,
   a piezoelectrical crystal,
   a positive feedback comprising a line connecting an input terminal of said third differential amplifier to an output terminal thereof, said line in turn comprising in series said crystal and a tuning capacitor,
   a second line, which comprises a first resistor and which connects said input terminal to ground or a first constant voltage through a decoupling capacitor,
   a third line connecting the other input terminal of the third differential amplifier to ground or the first constant voltage through said decoupling capacitor,
   a fourth line connecting said output terminal of the third differential amplifier to ground or a second constant voltage through a pulldown resistor.

7. A device according to claim 6, further comprising a plurality of lines connecting the input terminals of the third differential amplifier comprised in said oscillator to the input terminals of the first differential amplifier having its output terminals connected to each other.

8. A device according to claim 6, wherein said third line connecting the other input terminal of the third differential amplifier to said decoupling capacitor comprises a second resistor,
   and the resistance of said second resistor is essentially equal to the resistance of the first resistor.

9. A device according to claim 8, wherein the connection point of the first and second resistors to said decoupling capacitor is connected to a constant bias voltage through a third resistor.

10. A device according to claim 6, wherein said feedback line comprises a resistor which together with said capacitor in said line provides a low-pass filter for the definition of the oscillation condition of the oscillator.

11. An oscillator comprising:
    a differential amplifier having non-inverting and inverting input terminals as well as positive and negative output terminals, the signal on the negative output terminal normally being the negative of the signal on the positive output terminal,
    a piezoelectrical crystal,
    a positive feedback comprising a line connecting an input terminal of said differential amplifier to an output terminal thereof, said line in turn comprising in series said crystal and a tuning capacitor,
    a connection line, which comprises a first resistor and which connects said input terminal to ground or a first constant voltage through a decoupling capacitor,
    said output terminal being connected to ground or a second constant voltage through a pull-down resistor and
    whereby, with suitably chosen magnitudes of the components in the feedback line and the connection line from said input terminal to ground or the constant voltage, on said output terminal a square wave is obtained having a frequency defined by the magnitudes of these components arranged in said two lines, wherein the other input terminal of the differential amplifier also is connected to said decoupling capacitor through a third line comprising a second resistor, and the resistance of the second resistor is essentially equal to the resistance of the first resistor.

12. An oscillator according to claim 11, wherein the connection point of the first and second resistors to said decoupling capacitor is connected to a constant bias voltage through a third resistor.

13. An oscillator according to claim 11, wherein said feedback line comprises a resistor which together with said capacitor in the line provides a low-pass filter for the definition of the oscillation condition of the circuit.

* * * * *